United States Patent
Kinsman

[11] Patent Number: 5,930,602
[45] Date of Patent: Jul. 27, 1999

[54] LEADFRAME FINGER SUPPORT

[75] Inventor: Larry D. Kinsman, Boise, Id.

[73] Assignee: Micron Technology, Inc., Boise, Id.

[21] Appl. No.: 09/153,366

[22] Filed: Sep. 15, 1998

Related U.S. Application Data

[62] Division of application No. 09/006,237, Jan. 13, 1998.

[51] Int. Cl.[6] .................................................. H01L 21/48
[52] U.S. Cl. .......................... 438/123; 257/666; 257/667; 257/690; 257/784; 361/813
[58] Field of Search ........................... 438/123; 361/813; 257/666, 667, 673, 676, 678, 734, 784

[56] References Cited

U.S. PATENT DOCUMENTS

| | | | |
|---|---|---|---|
| 4,868,635 | 9/1989 | Frechette et al. | 257/670 |
| 5,150,194 | 9/1992 | Brooks et al. | 257/670 |

Primary Examiner—Charles Bowers
Assistant Examiner—Nema Berezny
Attorney, Agent, or Firm—Trop, Pruner, Hu & Miles, P.C.

[57] ABSTRACT

A leadframe includes a leadframe finger support for supporting elongate leadframe fingers. These elongate leadframe fingers are subject to damage prior to or during the assembly process. Through the provision of the leadframe finger support, the leadframe fingers may be supported at an intermediate position along their length as necessary to prevent bending. The support may be severed from the dam bar in the course of singulation.

2 Claims, 1 Drawing Sheet

LEADFRAME FINGER SUPPORT

This is a divisional of prior application Ser. No. 09/006,237 filed Jan. 13, 1998.

This invention relates generally to leadframes for integrated circuit packaging and particularly to the support of leadframe fingers.

BACKGROUND OF THE INVENTION

Leadframes are widely utilized in the formation of integrated circuit packages. They provide an integral piece which includes leads and contacts which may be wire bonded to bond pads on the die. The leadframe contacts are made to leadframe fingers which extend toward the die. One end of each leadframe finger receives a wire bond and is connected to the bond pads by wires formed in the conventional wire bonding process.

The opposite ends of the leadframe fingers connect to a dam bar or rail which supports the fingers prior to singulation. Each of the fingers extends outwardly from the dam bar to a position near to but spaced from the bond pads on the die. The leadframe fingers are encapsulated in a plastic material to form the package. During the package formation step called singulation, the dam bars are severed away from the remainder of the leadframe fingers.

It is sometimes necessary to use long leadframe fingers to connect to a particular bond pad. These elongated leadframe fingers are prone to being damaged prior to the package manufacturing process or during the package manufacturing process itself. In addition, these delicate leadframe fingers may be subject to leadframe finger sweep wherein as the encapsulant is added to form the plastic package, the leadframe fingers may be displaced, bent or otherwise damaged.

Thus, there is a need to prevent damage to elongated leadframe fingers used in leadframes.

SUMMARY OF THE INVENTION

In accordance with one aspect of the present invention, a leadframe includes a dam bar and a plurality of leadframe fingers extending from the dam bar. Each finger includes an end connected to the dam bar and a free end. A leadframe finger support extends from the dam bar to the finger between the finger ends.

In accordance with another aspect of the present invention, a packaged integrated circuit includes a die and a leadframe having fingers electrically connected to the die. At least one of the fingers has a bar extending from the finger and a free end which is unconnected.

In accordance with another aspect of the present invention, a method of packaging an integrated circuit die includes the step of forming a leadframe finger extending from a dam bar. The leadframe finger is supported along its length using a connection from the dam bar to a point between the ends of the leadframe finger. The die is molded and the connection from the dam bar to the leadframe finger is then severed.

DESCRIPTION OF THE PREFERRED EMBODIMENTS

Figure 1:
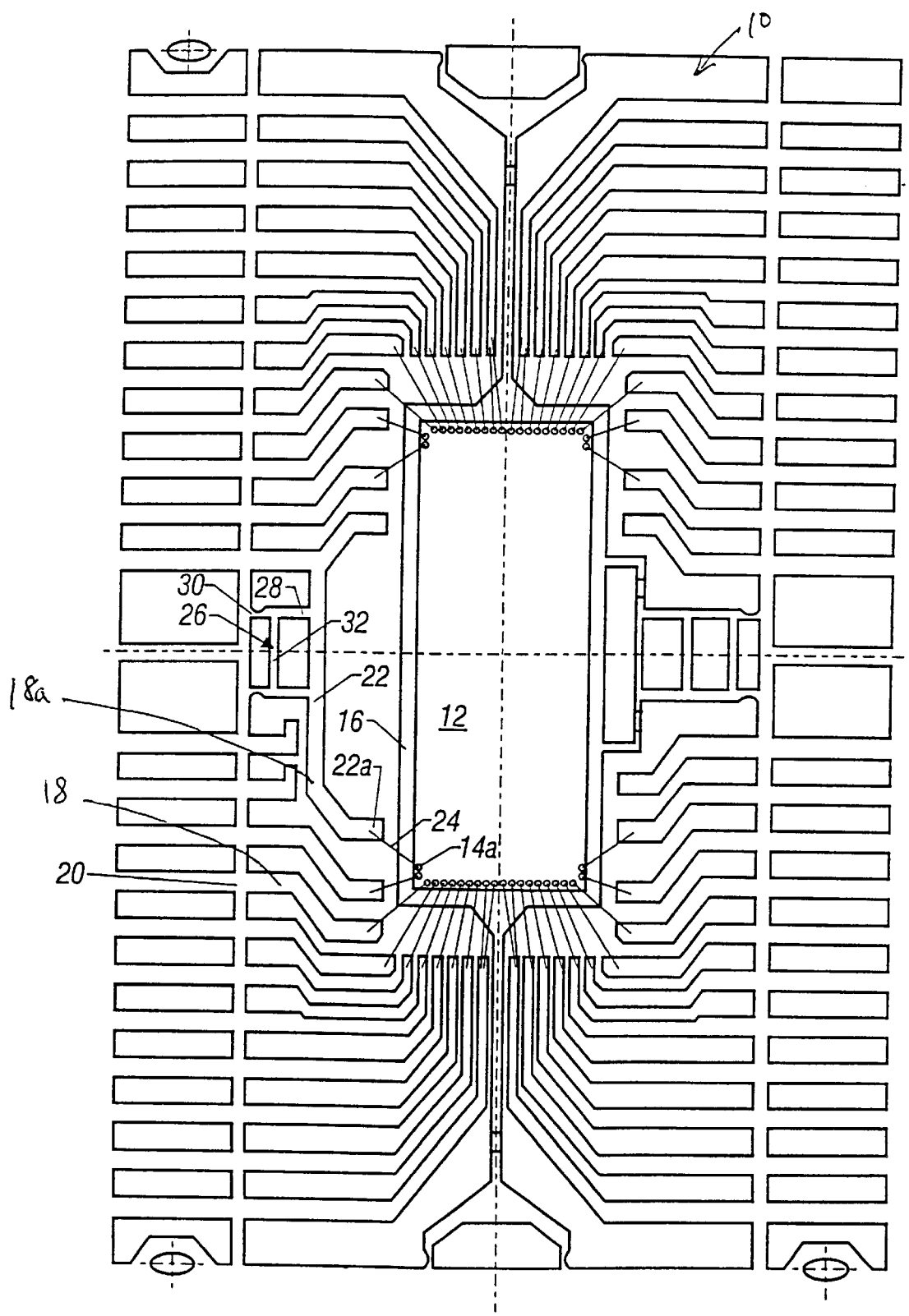
FIG. 1 is a greatly enlarged top plan view of a leadframe.

Referring to the drawing wherein like reference characters are used for like parts throughout the several views, a leadframe 10, shown in FIG. 1, supports a die 12 having a plurality of bond pads 14. The die 12 is supported atop a die paddle 16. The die paddle is connected to the leadframe 10.

A plurality of lead fingers 18 extend out from rails or dam bars 20. The free ends 22 of the leadframe fingers 18 are contacted by wires 24 which are wire bonded to the bond pads 14 and the leadframe finger free ends 22. In this way, the leadframe fingers 18 may be connected to the appropriate bond pads on the die 12.

The leadframe finger 18a is elongated. While the finger 18a connects to the dam bar 20 at a point on the upper half of the leadframe 10, the finger free end 22a is proximate to the lower end of the die 12. This is obviously necessary to enable the electrical connection to the bond pad 14a. As the finger 18a has a considerable extension and an elongate configuration, it is prone to flexing during assembly, potentially resulting in finger damage.

A leadframe finger support 26 includes a pair of bars 28 which directly connect by weakened or narrowed regions 30, called "rat bites", to the dam bar 20. A cross piece 32 is provided for additional structural integrity. Since the support 26 connects to the leadframe finger 18a at a point intermediate along finger's length, the support 26 provides structural support for the otherwise cantilevered leadframe finger. Without the intermediate support 26, the weight of the leadframe finger 22 and the fact that it is otherwise unsupported except at its point of connection to the dam bar 20 could result in bending of that leadframe finger 22a.

Thereafter, the leadframe 10 is molded in an encapsulant which forms the plastic package around the die 12. The rat bites 30 are severed to singulate the lead finger 22a. Another cut may be utilized to singulate the other elements of the leadframe 10.

While the present invention as been described with respect to a single embodiment, those skilled in the art will appreciate numerous modifications and variations. It is intended that the appended claims cover all such modifications and variations that fall within the true spirit and scope of the present invention.

What is claimed is:

1. A method of packaging an integrated circuit die comprising the steps of:

forming a leadframe finger extending from a dam bar;

supporting said leadframe finger along its length using a connection from said dam bar to a point between the ends of said leadframe finger;

molding the die; and severing the connection from said dam bar to said leadframe finger.

2. The method of claim 1 including the step of forming weakened sections, in the connection to the dam bar.

* * * * *